United States Patent

Bartolomei et al.

[11] Patent Number: 5,849,162
[45] Date of Patent: Dec. 15, 1998

[54] SPUTTERING DEVICE AND METHOD FOR REACTIVE FOR REACTIVE SPUTTERING

[75] Inventors: Leroy Albert Bartolomei; Thomas Read, both of Santa Rosa; Craig Shevlin, San Francisco, all of Calif.

[73] Assignee: Deposition Sciences, Inc., Santa Rosa, Calif.

[21] Appl. No.: 428,612

[22] Filed: Apr. 25, 1995

(Under 37 CFR 1.47)

[51] Int. Cl.$^6$ .................................................. C23C 14/34
[52] U.S. Cl. .................................. 204/192.13; 204/192.2; 204/298.03; 204/298.07; 204/298.19; 204/298.24; 204/298.26
[58] Field of Search ......................... 204/298.06, 298.03, 204/298.16, 298.07, 298.17, 298.18, 298.19, 298.2, 298.21, 298.23, 298.24, 298.26, 298.27, 298.28, 192.12, 192.13

[56] References Cited

U.S. PATENT DOCUMENTS

| | | | |
|---|---|---|---|
| 4,492,620 | 1/1985 | Matsuo et al. | 204/192 R |
| 4,851,095 | 7/1989 | Scobey et al. | 204/192.12 |
| 5,122,252 | 6/1992 | Latz et al. | 204/298.26 |
| 5,169,509 | 12/1992 | Latz et al. | 204/298.03 |
| 5,292,417 | 3/1994 | Kugler | 204/298.03 |

*Primary Examiner*—Nam Nguyen
*Attorney, Agent, or Firm*—Malcolm B. Wittenberg

[57] ABSTRACT

A method for reactive sputter coating in a chamber in which large substrates to be coated are transported past one or more coating stations. The stations are comprised of at least one sputtering target and at least one adjacent plasma generator. In the practice of this invention the sputtering and reaction zones within the chamber are indistinguishable.

19 Claims, 8 Drawing Sheets

SPUTTERING DEVICE AND METHOD FOR REACTIVE FOR REACTIVE SPUTTERING

TECHNICAL FIELD OF THE INVENTION

The present invention applies to the field of coating by reactive sputtering in which high rates of production in terms of area coated per second are required. Examples of coating processes which lie in the field of this invention are the production of hot mirror coatings for lamp housings, coatings on continuous substrates in a roll coater, or coating of window glass in an in-line coater. In such processes, the source of sputtered material is almost universally a magnetron sputtering target. In the case where the coating this is being applied is an electrical insulator, prior art processes suffer from stability problems that limit the amount of power that can be applied to the sputtering target and consequently also limit the rate of coating production. The present invention solves these problems, allowing coating processes to be carried out at levels of sputtering power that are limited only by the ability of the target to withstand heat generated by the process. Furthermore, at a given level of power dissipation by the target, the practice of the present invention can provide rates of coating production that exceed those previously attainable. For example, prior art in certain in-line process for coating silicon dioxide on large glass flats operates the target in a so-called "poisoned" mode in order to achieve process stability. This results in a considerable loss in sputtering rate so that even when the target is operated at the limit that is imposed by thermal considerations, relatively low rates are achieved. When the present invention is applied to such processes, the targets can be operated at the thermal limit in an unpoisoned mode while retaining stability. This results in a several-fold increase in sputtering rate.

In processes which lie within the field of this invention, the substrates are transported past a coating station by a transporting means such as rotatable drum, a system of rollers, or a translating table. Because of the large mass of the transporting means combined with the substrates, it is impractical to impart sudden motions to the transporting means, implying that its rate of translation must remain substantially constant. The rate of coating production an be characterized by the product of the dimension of the transporting device measured in a direction transverse to the motion, which is called the width, by the speed of transport. Coating processes in the field of this invention will typically have widths exceeding several meters or more and a speed exceeding 0.5 meters per second.

The present invention comprises in part at least one coating station whose dimension transverse to the motion of the transporting device exceeds the width of the group of substrates that is being transported. The station comprises at least one elongated sputtering target and at least one elongated plasma generator. These lie adjacent one another and have their long axes parallel and transverse to the motion of the transporting device. The plasma generator provides an auxiliary plasma which augments the plasma produced by the sputtering target, the action of which in the practice of the present invention solves the aforementioned stability problems associated with large reactive sputtering processes and provides the aforementioned sputtering rate increase.

DESCRIPTION OF PRIOR ART

Auxiliary plasmas have been employed in prior-art sputtering for many purposes. They are used for individually processing relatively small substrates such as silicon wafers. They employ devices which have inherent cylindrical symmetry and consequently generate a circular processing zone on a substrate. This type of symmetry usually requires that the substrate be positioned so as to be centered on the axis of symmetry while processing is being carried out. The substrate is then replaced by another and the process is repeated. With devices in this category, the substrates are motionless during processing and move before and after processing, so that their motion, in contrast to the motion in large industrial coaters addressed by this invention, is not constant. Coating rates achievable with these devices are much lower than those achievable with the present invention. Since these inventions are intended to process individual substrates one at a time, they differ fundamentally from the present invention in that they do not address the issues related to stability caused by electrical arcing, unstable return current paths, and target poisoning which limit the rate of production in large industrial reactive magnetron sputtering processes. These problems fall within the field of the present invention.

Matsuo et al. in U.S. Pat. No. 4,492,620 teach the use of a microwave-excited plasma in conjunction with a sputtering or chemical vapor deposition process. The plasma in their device is generated in a cylindrical microwave resonator located at the top of the apparatus. A strong magnetic field is provided in the resonant plasma-generating chamber so that the plasma is intensified by a phenomenon known to the art as electron cyclotron resonance (ECR). It then passes into a specimen chamber and is guided by the magnetic field lines past a sputtering target to a substrate. The apparatus of the Matsuo invention is inherently cylindrically symmetrical and coats a substrate whose diameter is approximately 75 mm. (3 inches). Sputter rates are low compared to rates achievable with the present invention, for example, rates of a few hundred Å/second of metallic aluminum are quoted in the reference, while, as will be shown, he present invention can achieve rates for fully reacted material which exceed 10,000 Å/minute. Matsuo et al. make no mention of the aforementioned issues which are critically important for devices which are within the field of the present invention where high production rates for large translatable substrates are required.

Saito et al's disclosure in U.S. Pat. No. 4,721,553 resembles that of Matsuo in that is adapted to coating small, non-translatable substrates and uses microwaves in the presence of a magnetic field to generate a plasma which is then used in conjunction with a sputtering target. Saito et al. do not teach the use of reactive gas. Therefore their invention not only fails to address issues associated with industrial reactive sputtering processes but is not intended for application to the field of reactive sputtering for which the present invention is intended and clearly is outside the field of the present invention.

Matsuoka et al. in U.S. Pat. No. 4,911,814 employ an arrangement that is similar to Matsuo, differing in that the cylindrically symmetrical plasma generating chamber is elongated along the symmetry axis to form a vertical tubular structure that points down at a substrate and also in that it employs two targets disposed at either end of the tubular chamber. The apparatus is circularly symmetrical with respect to the axis of the microwave resonator and generates a beam of ions of sputtered material that is 100 mm in diameter. The Matsuoka invention, like the others discussed above, fails to address the issues relating to large scale reactive magnetron sputtering.

Campbell et al. disclose in U.S. Pat. No. 4,885,070 a sputtering device in which an auxiliary plasma source in the form of an electron gun that is external to the coating chamber is employed. Electrons are guided under the influence of parallel electric and magnetic fields into a tubular ionization region within the coating chamber where they form a plasma by impact ionization of the gas in the chamber. Ions of the gas then move parallel to lines of force generated by a magnetic coil surrounding the ionization region into the vicinity of the target and substrate. Campbell et al. point out the benefit that are realized by the use of the auxiliary plasma. They claim higher sputter rates, improved quality of the coatings, and improved process stability over conventional magnetron sputtering.

Campbell et al. shows embodiments in which the substrate is a long strip of flexible material disposed on reels and guided post the sputtering target by passage over a rotatable coating cylinder. Therefore, unlike the inventions that have been cited earlier, their invention is applicable to coating substrates that translate continuously with respect to the sputtering target. Furthermore, they disclose embodiments that produce a beam having rectangular cross section, and which is therefore better adapted to coating a long strip that passes by a roller than embodiments having beams of circular cross section. They do not, however, disclose the dimensions of the rectangular beam.

The invention of Campbell et al. has the disadvantage that it is large, complex, and difficult to maintain in adjustment. The electron gun that must be attached to the chamber in the practice of this invention is roughly the size of the chamber itself. The invention also requires a significant number (on the order of six) independently adjustable electromagnets to provide control of the electron and plasma beams. Some of the magnets require position adjustments as well as optimization of the electric current that is supplied to them. Provision for removing heat caused by ohmic heating of the magnet coils that are in the coating chamber is required. As embodiment of the invention by Campbell et al. which has been scaled to the requirements of a drum, in-line, or roll cater where the substrate width is in the greater than thirty centimeters, would be voluminous, costly and complex.

While the Campbell et al. invention possesses certain features that belong to the field of the present invention, it is important to note that it does not employ magnetron sputtering, and is not proposed s a method for improving magnetron sputtering, but as an alternative to magnetron sputtering. Therefore, the above Campbell et al. patent necessarily does not teach a method for improving the process stability and reaction problems associated with reactive magnetron sputtering. Furthermore, unlike the present invention, the Campbell et al. invention is not pertinent to the art of large scale industrial reactive sputtering processes, since magnetron sputtering is almost universally used in such processes.

In another patent, U.S. Pat. No. 4,990,229, Campbell et al. disclose a series of processing devices intended for performing plasma assisted etching, deposition or sputtering. Each device includes a plasma generator driven by radio frequency power at 13.56 GHz. The plasma generator uses a novel antenna to launch a circularly polarized wave within a plasma generating vessel at the top of the vacuum chamber. Plasma generated in the vessel diffuses into a larger process chamber along magnetic lines of force generated by coils disposed at the ends of the vessel. A process such as sputtering or plasma etching takes place within the larger chamber in the presence of the plasma. Magnetic field gradients generated by permanent magnets mounted at intervals around the exterior confine the plasma within the region of the center of the chamber where the process takes place.

The plasma generating vessel is necessarily a right circular cylinder which tends to drive the design of the apparatus toward circular symmetry. In all the embodiments except one, the apparatus is circularly symmetrical. In one embodiment a group of plasma generating vessels is arranged on the top wall of the process chamber with individual vessels spaced at equal intervals along a straight line. The chamber is elongated in the direction parallel to this line. In no instance was the substrate or sample translated with respect to the generating vessel.

Only one of the embodiments of the Campbell, et al. invention was intended for sputtering. Campbell et al. do not teach the manner in which this embodiment of their invention should be used to perform reactive sputtering in a continuous sputtering process. Therefore, their invention fails to address the aforementioned problems relating to large scale industrial processes and falls outside the field of the present invention. It should be noted that the plasma generator, taken as a separate device, could be used as a component of the present invention. If a plurality of such generators could be arranged side by side in a straight line, the assembly when operated simultaneously would become an elongated plasma generator and conceivably cold be used as the auxiliary plasma generator in the coating station of the present invention.

There are two examples of prior art of industrial reactive sputtering worthy of discussion. In these examples, the stability and poisoning problems mentioned above are addressed. They apply to processes in which a rotatable drum is used as a means for transporting substrates through a sputtering zone adjacent to a sputtering target, and they teach the use of a separate reaction zone into which the substrates are subsequently translated. Within this reaction zone, reaction of the sputtered material with a reactive gas is achieved.

Separation of the deposition and reaction zones in an attractive option that is afforded by processes employing a rotatable drum to transport the substrates. Separation enables the avoidance of the previously mentioned phenomenon known to the art as "poisoning" in which reactive gas which has been introduced into the vacuum chamber for the purpose of reacting with sputtered material on the substrate reacts additionally with material on the surface of the target. The reaction of the gas, such as oxygen, with the material of the target surface, such as silicon, causes an accumulation of a layer of material, such as silicon dioxide, to occur on the target surface. The layer changes the secondary electron yield of the surface and interferes with the flow of electric current into the target. The result is a reduction in the rating of sputtering, generation of electrical arcs in the region of the target, and process instability. To overcome these problems, the prior art of reactive sputtering with a rotatable drum created separate zones; one in which deposition of sputtered material from the target occurs and another where reaction of the deposited material occurs. The use of separate zones prevented poisoning, since it prevented reactive gas from contacting the target.

U.S. Pat. No. 4,420,385 by Hartsough relates to the practice of reactive sputtering in a device employing a rotatable table in which the deposition and reaction zones are separated. In the practice of this invention, a substrate upon which a compound of the sputtered material with the reactive gas is to be formed is alternately passed over the sputter target and then passed through a reactive atmosphere so as to achieve the objective of separating the region of deposition from the region of reaction.

Hartsough also teaches the use of a plasma in the reaction zone for speeding the rate of reaction. Thus for example, it is taught that deposition of an oxide film is enhanced if oxygen in the reaction zone is activated by a plasma, since excited oxygen species react more readily with the metallic film than do ground state $O_2$ molecules.

Scobey et al. in U.S. Pat. No. 4,851,095 claim specific embodiment of the general device claimed by Hartsough. While Hartsough claims broadly the separation of the deposition and reaction zones, without specifying the degree of separation, and teaches the advantage of using a activating plasma in the reaction zone, Scobey et al. claim a localized plasma as the reaction zone, and emphasize the need for this plasma to be physically and atmospherically separated from the deposition zone. In fact, Scobey et al. differentiate from Hartsough's teaching by emphasizing the necessity to physically and atmospherically separate the deposition zone from the reaction zone by providing a zone of separation between them. This separation zone is baffled and differentially pumped in order to prevent the flow of reactant gas into the region of the sputter target.

A major disadvantage of the prior art as practiced by Scobey et al. is that the reaction with the substrate that takes place during each drum revolution occurs only after the entire layer of material to be reacted during that revolution has been deposited. Thus the material at the bottom of the layer will be protected from the gas by the material on the top of the layer if the layer is too thick. Therefore in the practice of the Scobey et al. invention, only a few monolayers can be deposited during each rotation of the drum. This requires high drum rotation rates in the order of 100 revolutions per minute in order to achieve an acceptable production rate. In an in-line process where it is desirable to deposit an entire coating layer during a single transit of the substrates past the coating station, the art as practiced by Scobey et al cannot be used. The present invention, by reacting the sputtered material as it is being deposited, can achieve deposition rates which allow deposition of an entire layer in a single transit past the coating station, and is therefore well adapted to use in an in-line process.

There are several other short comings which are unavoidable consequences of practicing the art as described above. Many of the consequences directly result from the need to physically an atmospherically separate the reaction and deposition zones. One disadvantage is that this separation obviously limits the number of targets and reaction zones that can be placed in a given vacuum chamber, and it therefore also limits the total rate of film deposition that can be realized with that chamber. Another disadvantage is that exposure of the newly-deposited unreacted film to background gases as it passes through the zone of separation can lead to contamination with resulting degradation of the properties of the film. A further disadvantage is that, other things being equal, the sputter rate of the target at a given level of power dissipation is often higher when the reactive plasma is present at the target location than when it is separated from the target. Thus in a situation where the sputter rate is limited by the maximum power dissipation that can be tolerated by the target, production of reacted film by the prior art is lower than that which achieved when an auxiliary plasma is available at the target.

It is an object of the present intention to overcome the above-cited disadvantages of the prior art by providing an apparatus and method of generating a plasma by means of a separate plasma generator located adjacent the sputtering target so as to blend the plasmas created by the target and the generator into a single continuous plasma which serves both to sputter material from the target and bring about a desired chemical reaction at the substrate, causing the sputter and activation zones to be collocated while eliminating any baffles or differential pumping.

It is a further object of this invention to provide the capability to deposit an entire coating layer in a single transit of the substrates past the coating station, thereby achieving compatibility with industrial in-line coating processes.

It is still a further object of this invention to use, in conjunction with a means for active gas control, a single continuous plasma in the collocated sputtering and deposition zones to render the reactive sputtering process more stable than has been possible with prior art.

It is further an object of this invention to generate an auxiliary plasma in such a way that it has an elongated spatial distribution so as to be useful in a process in which the width of the area on which deposition is to be accomplished measured in a direction transverse to the motion of the substrates can be made compatible with large industrial processes.

It is still further object of this invention to avoid the necessity to provide a separate region within the chamber within which reaction occurs, and by the elimination of this region to increase the number of coating stations which can be placed within a given chamber.

It is still a further object of this invention to generate said auxiliary plasma without the use of additional electrodes within the chamber.

It is still a further object of the invention to provide said auxiliary plasma by a means which allows the sputtering target to be placed in close physical proximity to the substrate.

It is still a further object of this invention to generate said plasma in a manner which does not significantly increase the evacuated volume of the chamber.

It is still a further object of this invention to provide said auxiliary plasma in the region of target and substrate without the use of magnets except those which are components of the magnetron sputtering target or the means for introducing the plasma, thereby eliminating the need for large and complex magnetic apparatus.

SUMMARY OF THE INVENTION

The present invention is a device and process for enhancing the production rate and quality of sputtered film in a reactive sputtering process which employs a vacuum chamber and a means for transporting substrates past a coating station. The invention may be adapted to a batch process wherein the transporting device is a rotatable drum or table or to an in-line process in which the transporting device causes the substrates to move in a straight line past the coating station.

The coating station comprises a magnetron sputter device capable of depositing a selected material onto the substrates and an adjacent elongated plasma generating device which is elongated in a direction transverse to the motion of the substrates. During sputtering the plasmas generated by the sputtering target and the generating device interdiffuse so as to form one continuous activating and sputtering plasma. It is therefore essential to the practice of the invention that the sputtering target and the elongated plasma generator be spatially and atmospherically contiguous.

The plasma generator couples energy into the plasma by a means which does not require that additional electrodes be placed in the chamber. The generator is provided in an elongated form allowing treatment of large substrates. In contrast to prior art, the generator is placed adjacent the sputtering target so that the substrate and target can be placed as close to one another as desired and additional chamber volume is not required in the practice of the present invention. Furthermore, the close proximity of the applicator to the target and substrate allows the continuous plasma in the vicinity of the target and substrate to be distributed by ambipolar diffusion in the presence of local magnetic fields created by magnets within the target or generator, without the generation of an additional magnetic field by external magnets.

As will be explained, in the practice of the invention, high coating rates are achieved while avoiding an undesirable phenomenon known as target poisoning by means of control that is exercised over variations in pressure within the chamber and/or gas flow into the chamber.

U.S. patent application Ser. No. 08/371,195 filed on Jan. 11, 1995, pending, the disclosure of which is hereby incorporated by reference, teaches the use of a plasma generator in conjunction with a sputtering target in a reactive sputtering process to provide a distributed plasma which serves as a reliable path for sputtering current during the process, bringing about an improvement in process stability. Furthermore U.S. patent application Ser. No. 08/388,191, pending, filed on Feb. 13, 1995, the disclosure of which is incorporated by reference, teaches the use of a plasma generator in conjunction with a sputtering target and arc suppression system for the purpose of reducing the frequency and severity of electric discharges within the chamber. The practice of the present invention can be combined with the teaching of the above-cited applications to achieve improved process stability as well as improved quality of the coating due to enhancement of arc-suppression system which is employed by the process.

DETAILED DESCRIPTION OF THE INVENTION

Figure 1:
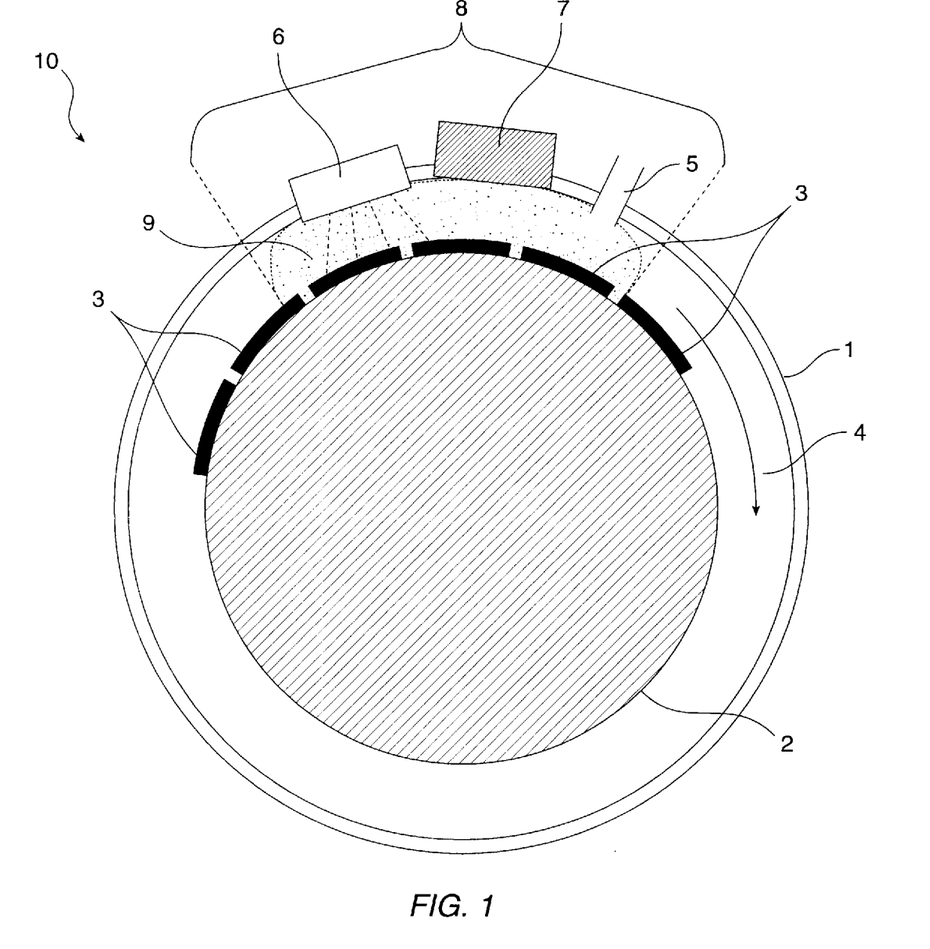
FIG. 1 is a schematic of a section view of a coating process using the present invention.

FIG. 1 shows a schematic of a section view of a system in which a reactive sputtering process is carried out using the present invention. Reactive sputtering system 10 comprises housing 1 which is shown as being circular in cross section, but which can take other shapes. The circumference of the housing defines a vacuum or low pressure environment, which contains a means 2 for transporting a plurality of substrates 3 in the direction shown by the arrow 4 past the sputtering target 6 and at least one adjacent elongated plasma generator 7, and at least one inlet 5 for the introduction of a sputtering gas such as argon and a reacting gas such as oxygen into the sputtering chamber. When the system is operated, a vacuum pump, not shown, is connected to the housing and the pressure within the chamber is maintained within a range between $10^{-4}$ and $10^{-2}$ torr, a negative voltage (nominally $-500$ volts) is connected to the target, and the elongated plasma generator is activated. As will be discussed in detail later, a plasma is generated by the combined action of the target and the plasma generator, so that the target and the microwave generator become a single coating station 8, which brings about the deposition and reaction of the sputtered material. The plasma generated by this coating station is most concentrated in the region 9 which occupies the space between the station and the transporting means; however, it diffuses into the surrounding space within the chamber so that it is present at low concentration at locations that are removed from the station.

As the substrates are transported by the motion of the rotatable drum into the region between the target and the drum, sputtered material is deposited on the substrate and immediately begins to combine with the reactive gas in the chamber. The reaction continues during subsequent motion of the substrates through region 9 of a greatest plasma concentration until the deposited material is fully reacted. This is in sharp contrast to the Hartsough and Scobey et al. patents which teach that the deposition and reaction zones should insofar as possible be isolated from one another. As previously indicated, in the practice of the present invention reaction of the material takes place immediately upon deposition, which allows a considerably thicker layer to be deposited during a single motion of the substrate past the target than has been achieved with prior art.

The practice of the present invention facilitates process control, enabling achievement of higher rates of production when a single sputtering and reaction station is provided than when separate deposition and reaction zones are used. By means of this improved control it is possible to achieve high production rates without target poisoning. Data shows that when the flow of reactive gas into the sputtering chamber is carefully controlled, higher deposition rates are indeed achievable.

Poisoning results when oxidation of the surface of the sputtering target interferes with the flow of direct current through the target and inhibits further sputtering from the target. In prior art, poisoning was avoided by preventing reactive gas from contacting the target. With the present invention, poisoning is avoided by increasing the ratio of the concentration of activated species to the concentration of unexcited gas.

An example of the present invention is presented in which silicon dioxide is deposited by sputtering silicon in a chamber containing at least oxygen and argon. The rate of the oxidation reaction at the substrate surface depends on the concentration of excited oxygen species that are in contact with the sputtering surface in the energetic non-equilibrium zone of the sputtering region. These reactive species are generated by the target with its associated electric and magnetic fields mainly by interactions involving diatomic oxygen that diffuses into the reaction zone. Therefore, the concentration of these species and the rate of oxidation at the surface of the target depends on the oxygen pressure in the vicinity of the target. When the partial pressure of oxygen exceeds a threshold value, the concentration of reactive species within the sputtering zone becomes great enough to cause poisoning.

The reaction of sputtered material takes place at the substrate at a relatively low temperature. This reaction is between the substrate and activated species of oxygen, such as monatomic oxygen, or between the substrate and diatomic oxygen. At the low substrate temperature the activated species of oxygen have a much higher chemical affinity for the substrate material than does molecular oxygen. For example, the reactive species monatomic oxygen has a much higher affinity for silicon than does diatomic oxygen since a reaction with diatomic oxygen requires energy to break the oxygen-oxygen bond, while the reaction with monatomic oxygen does not. Because of the higher chemical affinity of the reactive species, the probability that a given atom of deposited silicon will react with the atmosphere within the chamber increases as the concentration of reactive species at the substrate increases. Reactive species are generated within the plasma and their concentration is proportional to the partial pressure of oxygen in the chamber as well as the power that is being delivered to the plasma within the chamber. With prior art the power was provided entirely by the target, while the present invention allows power of the plasma to be increased by an amount that is greater than the amount being delivered to the target alone. Therefore the present invention brings about a substantial increase in the rate of reaction of the sputtered material at the substrate.

For the substrate to be fully reacted, the rate of reaction must be equal to the sputtering rate. The rate of reaction increases with the concentration of reactive species which in turn varies as the product of the partial pressure of oxygen in the chamber and the total power being delivered to the plasma. Therefore, if complete reaction at the substrates is to be achieved when a fixed amount of power is being delivered to the plasma, the partial pressure of oxygen will have to exceed some level. This pressure of complete reaction decreases as the power delivered to the plasma increases. In order to achieve a complete reaction, it is necessary that the pressure for complete reaction be lower than the pressure threshold for poisoning. In practicing the present invention, the level of power that is applied to the plasma is sufficient to reduce the pressure for complete reaction so as to meet this condition.

It will now be shown that the present invention inherently provides enhanced control of the oxygen partial pressure, enabling the pressure to be maintained above the pressure for complete reaction without ever reaching the poisoning threshold.

Figure 2:
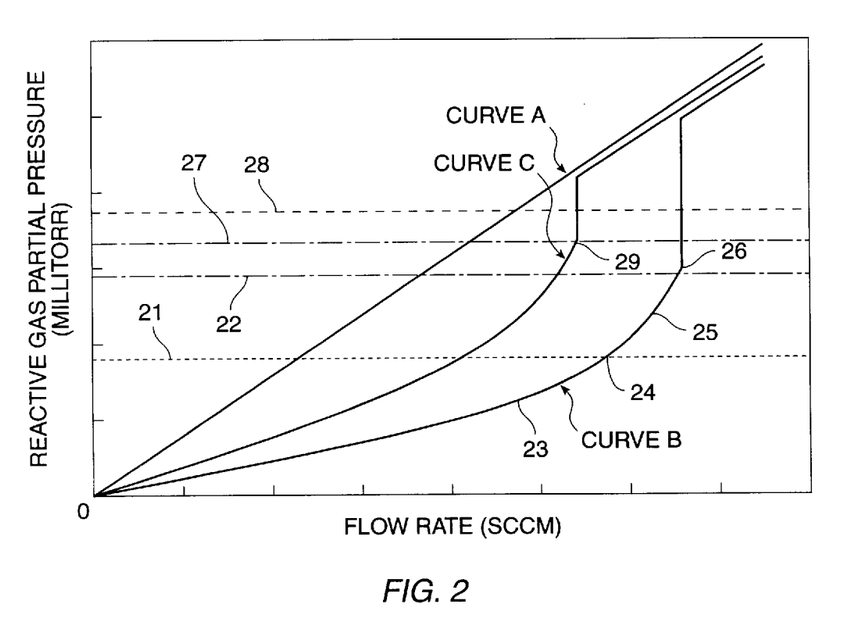
FIG. 2 shows plots of reactant gas pressure versus reactant gas flow and illustrates the manner in which the practice of the present invention facilitates process control.

FIG. 2 show typical plots of reactant gas partial pressure in militorr vs. reactant gas flow in standard cubic centimeters per minute (sccms) into the sputtering chamber containing the apparatus of the present invention including a rotatable drum, substrates, an elongated plasma generator, and a sputtering target. In the example shown in FIG. 2, the reactant gas is oxygen and the sputtered material is silicon. Argon and oxygen are introduced into the chamber and a vacuum pump is connected to the chamber. Curve A shows how the partial pressure of oxygen varies with oxygen flow into the chamber when the target and plasma generator are turned off. Curve A is a straight line given by the equation $$P = \phi/S \quad (1)$$

where S is the speed of the pump that is attached to the chamber, P is the chamber pressure and $\phi$ is the flow of oxygen into the chamber. Equation (1) expresses the equality of flow into and out of the chamber.

Again referring to FIG. 2, curve B, shows how the partial pressure of oxygen varies with oxygen flow when practicing the present invention. For the purpose of this explanation, it is assumed that the target is operated at some fixed power level; for example, it may be operated near the maximum power level which is permitted by thermal considerations. The power applied to the plasma generator is set at a level which causes the pressure for full reaction to be at the level shown by the dashed line 21. This level is lower than the threshold for poisoning shown by the dot-dash line 22. Curve B differs from curve A for the following reasons. Curve A portrays the situation when no sputtering is occurring and therefore no oxygen is being consumed by the reaction with silicon on the substrate. The reaction of silicon with reactive species of oxygen at the substrate consumes oxygen at a rate proportional to the oxygen pressure so that at low levels of oxygen flow represented by point 23 in FIG. 2, the oxidation reaction acts like a second pump. This second pump causes the overall pump speed S in equation (1) to become greater, with the result that curve B in the region of point 23 has a slope that is less than that of curve A and lies below curve A.

At point 23 the oxygen flow is relatively low and the oxygen partial pressure is too low to cause poisoning of the magnetron sputtering target. The surface of the target is divided into two regions, a region in which the magnetic field lines are concentrated in which material is being sputtered and a second region constituting the remainder of the surface, which is covered by an oxide layer from which no sputtering occurs. If the flow of oxygen into the chamber is held constant the condition of the target remains steady. All of the consumption of oxygen at the target leads to the oxidation of sputtered material, and accumulation of oxide in the sputtering region does not occur. If, however, the oxygen flow, and consequently the oxygen partial pressure, is allowed to increase, the oxide layer which covers the on-sputtering region begins to expand, covering some of the sputtering region and causing a reduction of the sputtering rate. The reduced sputtering rate brings about a corresponding loss in the pump speed of the sputtered material, which in turn causes curve B to deviate from a straight line, so that it becomes steeper at higher partial pressures of oxygen. The pressure continues to rise with increasing flow until it reaches point 24 where the pressure in the chamber is such that the reaction on the substrate is complete. As the pressure is further increased beyond that at point 24, the consumption of oxygen no longer increases with pressure, but remains constant, since al the sputtered material is being oxidized. For pressure increases beyond point 24 the vacuum pump is the only pump so that the slope of curve B approximates that of curve A and the pressure rises more rapidly as the oxygen flow is increased.

It is necessary to prevent the oxygen partial pressure from exceeding the poisoning threshold. To achieve this a flow control system is used to maintain the flow at a level that maintains the flow and pressure at a point in the region of point 25 which is slightly higher than the pressure at which full compounding occurs. Since the present invention provides a sufficient concentration of reactive material to completely oxidize sputtered material before poisoning occurs, there is a pressure domain containing point 25 in which the pressure varies slowly with flow, os that flow control is relatively easy in that domain. The flow control system maintains the pressure and flow at the constant level of point 25 where the slope of curve B begins to increase. Control remains effective for the duration of the process so that a fully compounded coating is deposited during the entire process. The deposition rate is high since it is augmented by the presence of the auxiliary plasma.

The enhanced ease of partial pressure control of conditions provided by the present invention becomes more critical as the scale of the process becomes larger. The reason for this is the delay of the response in pressure to a change in gas flow is proportional to the volume of the chamber and inversely proportional to the pump speed S. Often there is a practical limit on the value of S which can be achieved, so that for larger chambers, the response of pressure to commanded changes in flow is delayed. The delay in response can lead to instability when the variation of chamber pressure with flow is not slow enough.

Note that while the partial pressure of reactive gas in the variable that must be controlled during the process, control may be achieved by sensing other parameters that vary smoothly with the pressure. Intensity of spectral lines of species within the plasma may be used. Still another technique is to control the flow based on variations in the target voltage.

Referring again to FIG. 2, had the pressure been allowed to increase substantially beyond that of point 25, the poisoning threshold at point 26 would have been approached. The process of poisoning takes place in the following manner. The incursion of the layer of insulator into the sputtering region that has been described become larger so that the sputtering current decreases and the sputtering rate is reduced. The decrease is sputtering rate causes a reduction in the pumping action of the sputtered material, which again increases the pressure. A runaway condition occurs in which the oxygen partial pressure suddenly increases and sputtering almost entirely stops as does the pumping action that had previously resulted from the sputtered material. Thus curve B closely follows curve A at flow rates in excess of the flow at point 26. Once poisoning has occurred curve B becomes irreversible, and subsequent reduction of the pressure causes it to continue to follow curve A until the pressure becomes considerably less than that of point 26.

Now consider the situation in which the plasma generator is not present. The concentration of reactive species at the substrate is lowered by the absence of the generator, so the rate of reaction of the film at the substrate and the pump speed of the oxidation process are also lowered. Therefore, curve C of FIG. 2, which applies to this case has a higher slope than curve B and lies between curve B and curve A. As noted below, the target current is lower and the sputtering rate is less than when the generator was present, particularly when the magnetic field in the sputtering target is "unbalanced". Since the lower current creates a condition in which oxide is less likely to be eroded away, the target is more subject to accumulation of oxide on the sputtering surface and has a lower poisoning threshold pressure, indicated in FIG. 2 by line 27. Since the partial pressure for a complete reaction is inversely proportional to the power that is being applied to the plasma, and no microwave power is being applied in the case of curve C, the pressure required for a complete reaction shown by line 28 is higher by a factor of two or so for curve C than for curve B and therefore exceeds the poisoning threshold. As the flow of oxygen is increased, curve C rises steeply to the poisoning threshold at point 29 and then jumps sharply to meet curve A as the target poisons. Sine the pressure for complete reaction was not reached, the process without the auxiliary plasma provided by the present invention did not provide a complete reaction at the substrate.

It was this problem that led prior art represented by the Hartsough and Scobey et al. patents to conclude that high-rate reactive sputtering of materials such as silicon dioxide was not practical without providing distinct deposition and reaction zones. The discovery of the present invention is that such separation is not necessary or desirable when the auxiliary plasma is sufficiently intense and when proper control of the partial pressure of reactant gas is provided.

It has been shown that the present invention can bring about the formation of fully reacted films within the coating zone by means of an increased rate of compounding and a stabilized pressure response that aids in process control.

As previously noted, the invention described in U.S. patent application Ser. No. 08/371,195, pending, discloses the use of a plasma generator that is installed adjacent to a sputtering target in order to achieve short term process stability when sputtering is being conducted with a power supply that employs voltage interruption or reversal to suppress arcing. In many such prior-art processes, especially those in which materials such as aluminum oxide or silicon dioxide are being deposited, electrical arcing causes total disruption at sputtering power levels that are considerably lower than the thermal limit of the sputtering target. The invention just cited, when used in conjunction with the present invention, increases the effectiveness of the arc-suppression means provided by the power supply and therefore improves process stability by reducing the intensity and frequency of such arcs.

U.S. patent application Ser. No. 08/371,195, pending, teaches the use of a plasma generator adjacent to a sputtering target to provide a return for anode current which endures for the duration of the sputtering process. In the practice of this latter invention, long term process stability is achieved. The practice of the present invention, by providing at least one elongated plasma generator adjacent the sputtering target, automatically provides the long and short term stability advantages of the two inventions just cited. Attainment of short and long stability allow operation of the sputtering target at a power level which can be increased until it is limited by thermal considerations. The present invention allows achievement of a fully reacted film when sputtering at this thermally-limited level, providing a total deposition of fully reacted film during a single transit past the sputtering target which is greater than can be achieved with the prior art of in-line processes.

The present invention allows the production of a fully reacted film at a rate corresponding to the thermally-limited sputtering power. In some cases, in particular, when silicon dioxide is sputtered and reacted with oxygen to obtain silicon dioxide, the sputtering rate at a fixed power level, such as the thermally limited power can be increased by the practice of the present invention.

The plasma generated at the coating station by the elongated plasma generator of the present invention causes the operation of the target and plasma generator to become interdependent. This may be understood by reference to FIG. 3 which shows a section through a coating chamber. Within the chamber there is a coating station comprising an elongated plasma generator 40 and a sputtering target 32 which are shown symbolically for purposes of illustration only. The chamber is shown with upper and lower walls 41 and 33 in a configuration such as might occur in an in-line coating process. The side walls are not visible in the section view. Substrates 34 are transported n a transporting means 35 so that they move past the station in the direction of the arrow 36. When the coating station is operating, power is applied to the plasma generator 40 and a power supply 37 is connected between the sputtering target 32 and the chamber walls, 41 and 33. A plasma is generated by the station which is most intense in the region 38 between the station and the transporting means. Power to maintain the plasma is obtained from DC sputtering power supply and also from the power entering the plasma generator. Sputtering current flows through this plasma from the target to the chamber walls as shown by the arrows 39, 30, 31, and 42. The arrows 29 and 42, representing a current path between the sputtering target and the transporting means is shown dotted, since the transporting means is not usually grounded and consequently, this path is often not present.

Figure 3:
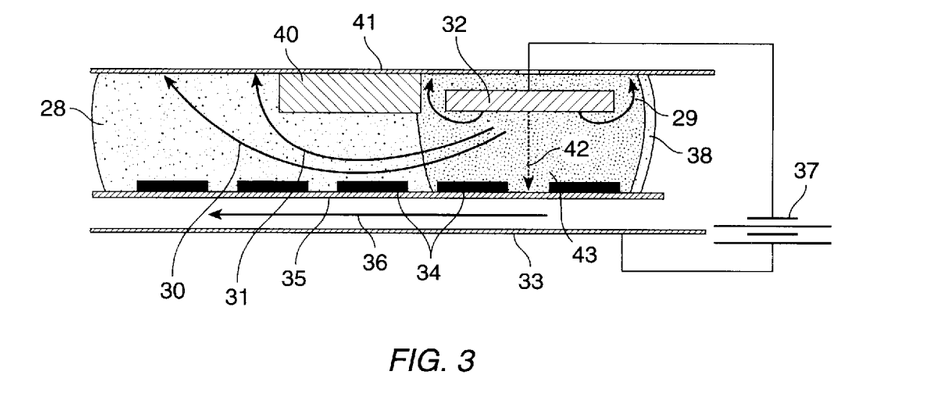
FIG. 3 is a section through a coating station used to illustrate its electrical properties.

If the plasma generator had not been activated, the plasma generated by the target alone would have occupied the smaller region 43 adjacent to the sputtering target, and only the current paths shown by the arrows 39, 29 would be available. Thus activation of the plasma generator increases the flow of current that flows when a fixed voltage is applied to the sputtering target by the power supply 37. Making an analogy between the plasma and an electrical resistance, it can be stated that the resistance of the plasma is decreased by the microwave power that is delivered to it by the plasma generator 40. This causes electrical coupling between the two devices which provides a number of beneficial effects.

The amount of coupling between the plasma generator and the sputtering target can be varied by altering the configuration of the magnetic filed in the vicinity of the sputtering target. If the magnetic field lines are largely confined to a region that is close to the surface of the target, flow of electric current from the target to the adjacent plasma is inhibited by the magnetic field gradient in the current path and consequently the presence of the auxiliary plasma in reducing the apparent electrical resistance in the path from the target to ground is somewhat suppressed. This will cause a reduction in electrical coupling between the target and the auxiliary plasma. On the other hand, coupling can be enhanced by providing a magnet configuration for the sputter target which causes magnetic field lines to diverge from the target. In the former case, where the field is tightly confined in the target region, the magnetron target is said to be balanced, while in the latter case, it is said to be unbalanced.

Figure 4:
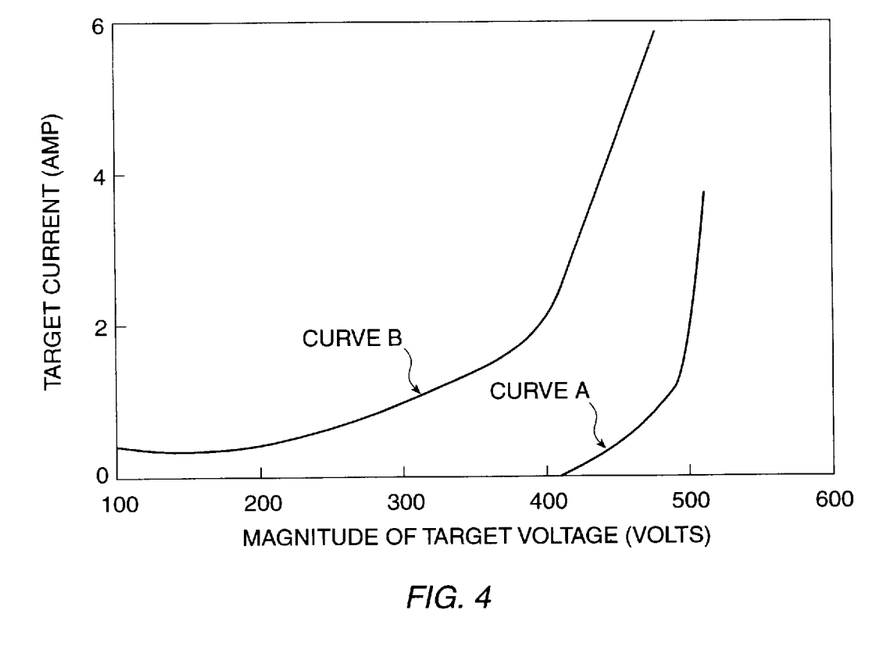
FIG. 4 shows plots of target current versus voltage when the current invention is being used with different levels of microwave power being applied to the plasma generator.

A plot of target current against sputtering power supply voltage is shown in FIG. 4 as curve A. The plot was made using a 15 inch long unbalanced magnetron target installed in a chamber adjacent to a plasma generator under typical sputtering conditions when the adjacent plasma generator was not operating. Curve A shows that as the voltage from the power supply was raised from zero volts, there was no current flow until the voltage exceeded a threshold value, 410 volts in this particular case. At this voltage a plasma was ignited within the chamber and the current rose steeply as the supply voltage was further increased.

Curve B of FIG. 4 shows the dependence of current on voltage when the adjacent plasma generator was energized by a fixed level of microwave power and created a plasma that contacted the target, as could be observed by visual observation of the target through a window in the chamber. The curve shows that as the power supply voltage was increased from zero volts, current immediately began to flow through the plasma that had been generated by the microwaves. As the voltage was increased further still, so that positive ions accelerated to the target caused secondary electron emission from the target surface, the sputter power supply began to contribute the plasma generation process and the increase in current with voltage become more pronounced.

In comparing curves A and B, it is apparent that when the microwave-generated plasma is present, more current flows from the target than when it is absent; in fact, when the plasma is present, significant current is drawn from the target at voltages for which there would no current flow without the plasma. The sudden onset of current at the threshold voltage which is observed in curve A does not occur in curve B, so that there is no clear indication from curve B that a plasma ignites at a particular value of the target voltage. Instead, the microwave-generated plasma that was initially present when the target voltage was zero steadily increases in density as the target voltage rises and accordingly the target contribution to the plasma generating power increases. This is confirmed by visual observation.

It is experimentally observed that at any given value of the target voltage the current increases as the microwave power applied to the generator increases. This is due to the fact that as the applied microwave power increases, it generates a more dense plasma, providing a current path through the plasma to the walls of the chamber that becomes less resistive. Therefore the practice of the present invention increases the flow of target current at a fixed power supply voltage. Additionally, for the same power level, the sputtering current will increase as the microwave power increases, resulting in a lower voltage (since I×V=cost.). This enables the achievement of a higher sputtering rate.

The sputtering yield, Y, defined as the ratio of the number of atoms sputtered from the target to the number of ions striking it, is a quantity that can be readily measured experimentally and depends upon the sputtering voltage, V. The measured dependence of Y on V can be fit to an expression of the form.

$$Y = a \times V^b \qquad (2)$$

where a and b are constants and b is less than one.

Figure 5:
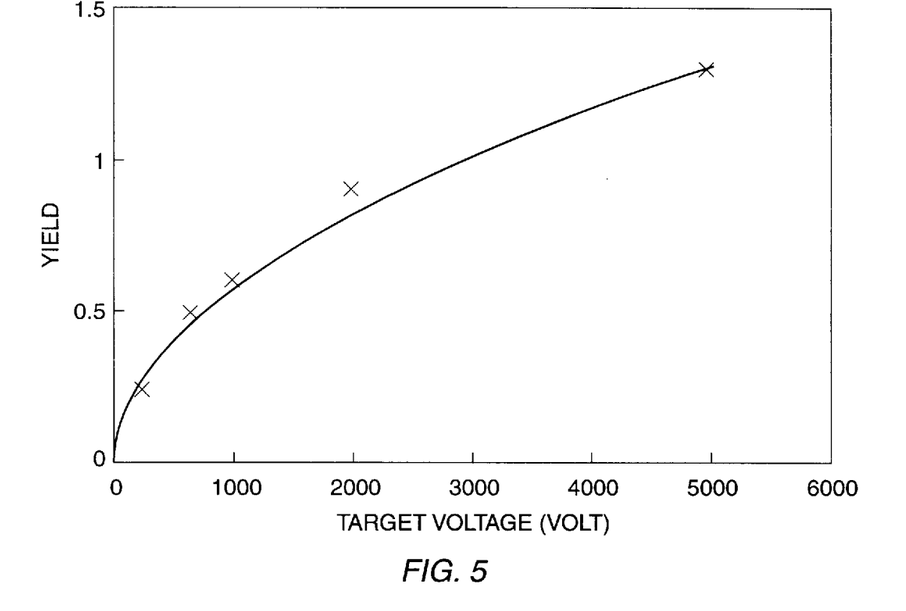
FIG. 5 is a plot of sputtering yield versus target voltage for a silicon target.

FIG. 5 gives an example of measured dependence of Y on V, the particular case taken for the example being that of silicon sputtered in argon. Experimental data are shown by X's and the solid curve is a curve of the form (2) the value of a being 0.0185 and that of b being 0.5. The figure shows close agreement between the experimental data and then solid curve.

When sputtering in an unpoisoned mode, the sputter rate, R, is given by $$R = C_1 \times Y \times I \qquad (3)$$

where $C_1$ is a consent that depends on the target geometry, and I is the target current. Substituting (2) into (3) using a value of 0.5 for b in accordance with the measured data, the following relation is obtained:

$$R = C_2 \times I \times V^{0.5} = C_2 \times P / V^{0.5} \qquad (4)$$

where P=I×V is the electrical power being delivered to the substrate and $C_2 = a \times C_1$, which is another constant. From (4) it may be seen that the sputtering rate always increases as the target power is increased, since the power varies at least as the second power of V.

In a practical system, the maximum sputter rate is limited by the power that can be applied to the target without damage such as debonding of the backplate or warping caused by overheating. Comparing two identical sputtering targets that are operating at the maximum permissible power, the first of which has an adjacent plasma generator while the second does not, and using equation (4), one obtains $$R_1 / R_2 = (V_2 / V_1)^{0.5} \qquad (5)$$

where $R_1$ and $V_1$ are the sputtering rate and voltage on the target with the microwave generator and $R_2$ and $V_2$ are the rate and voltage at the target without the generator. Since, as was shown above, the presence of the adjacent generator causes $V_1$ to be less than $V_2$, an increase in the sputtering in the ratio $(V_2/V_1)^{0.5}$ is brought about by the practice of the present invention.

The elongated plasma generator used in the practice of the present invention may be of any type that is capable of delivering power to a plasma that has a substantially uniform distribution along the long axis of the device so as to generate a plasma whose dimension transverse to the line of motion of the substrates exceeds the width of the region over which substrates are to be coated.

A suitable applicator is described in U.S. patent application Ser. No. 08/371,195, pending. This type of applicator, which will hereinafter be called a "plasmaguide," may have a variety of physical shapes. For the present application it would generally have a rectangular cross section whose dimensions depend on the wavelength of the microwaves that are driving it and upon other factors. When being operated it receives microwave power from a waveguide, and plasma is generated along the surface of the device which forms its boundary with the atmosphere of the coating chamber, it is installed on or in the wall of the chamber so that the surface upon which plasma is generated faces the substrates and plasma is generated above the entire width of the area which contains substrates to be coated.

The length of the applicator may be tailored to the width of the substrates; devices having a length of the device if a microwave supply having sufficient power is available. The devices may be used in combination; for example, if it is desired to coat substrates that are four meters wide, two generators placed end to end may be employed. Also in some embodiments, applicators are placed on both sides of a sputtering target.

A second type of elongated applicator has been disclosed by Kieser in U.S. patent application Ser. No. 4,630,568. This device employs the electric field developed in a traveling wave structure to generate a plasma at the surface of a window that is penetrable by microwaves. As with the plasmaguide generator, the Kieser applicator is mounted on or in the wall of the coating chamber so that the window upon whose surface a plasma is to be generated faces the substrates. This type of applicator is called a traveling wave applicator.

As has been mentioned earlier, it is an essential element feature of the present invention that the sputtered material be fully compounded while the substrate are within a coating zone that is adjacent to the station. In many cases, this requires control of the reactive gas flow in order to achieve a high concentration of reactive gas within the coating zone. As taught in U.S. patent application Ser. No. 08/371,195, pending, which applies to the plasmaguide generators, at least one manifold may be built into the plasma generator, regardless of its type, in order to introduce the gas directly into this zone and thereby to achieve the required localized high concentration.

It has been shown that the present invention increases the allowable rate of sputtering in a DC reactive sputtering process. With the present invention the reaction at the substrate surface begins immediately upon deposition so that reaction of the deposited material is not limited by the thickness of the deposited layer, and further, the sputter rate for a given sputtering power is often higher. In the practice of the present invention to deposit oxides on substrates, rates of deposition have been achieved which far exceed those achieved by prior art. For example, using the present invention, clear silicon dioxide has been deposited at over-the-target rates exceeding 180 Å/sec, nearly double those reported in U.S. Pat. No. 4,420,385. Similar results have been achieved in depositing other materials.

Figure 6:
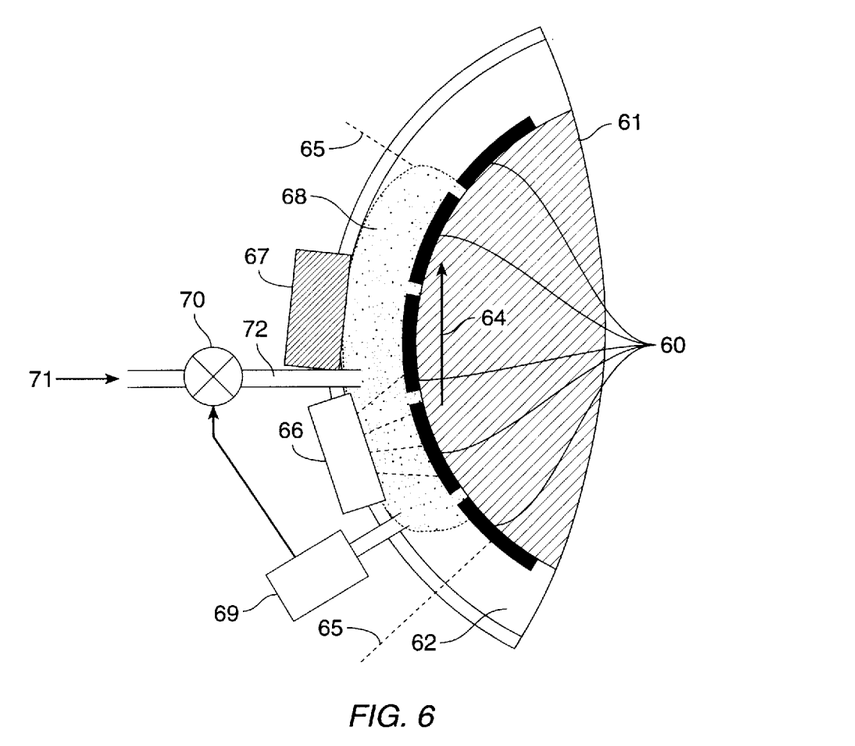
FIG. 6 is a section through an embodiment of the invention when used in a chamber having a rotatable drum.

FIG. 6 shows a section through an embodiment of the invention in which a plurality of substrates 60 is mounted on a rotatable drum 61 in a chamber 62 and conveyed in the direction of the arrow 64 past a coating station located between the dotted lines 65 comprised of an elongated sputtering target 66 and at least one adjacent elongated microwave activated plasma generator 67 which together generate a region of plasma which is most concentrated in the region 68. When reactive sputtering is being carried out in the chamber, the overall pressure within the chamber is maintained at a suitable low level, and a control system maintains the partial pressure of reactive gas at a level that is less than the poisoning pressure and greater than the pressure for complete reaction. The control system, comprises, in part, the pressure sensor 69 and the flow controller 70. Reactive gas 71 whose flow is governed by the flow controller, is introduced into the chamber through at least one opening 72 or manifold that is designed in such a manner as to cause a high concentration of reactive gas in the region 68. A manifold may also be incorporated into the plasma generator. As the substrates move past the coating station, they receive a coating or sputtered material from the target and this coating is fully reacted by the time that the substrate motion causes them to leave region 68 of concentrated plasma.

Figure 7:
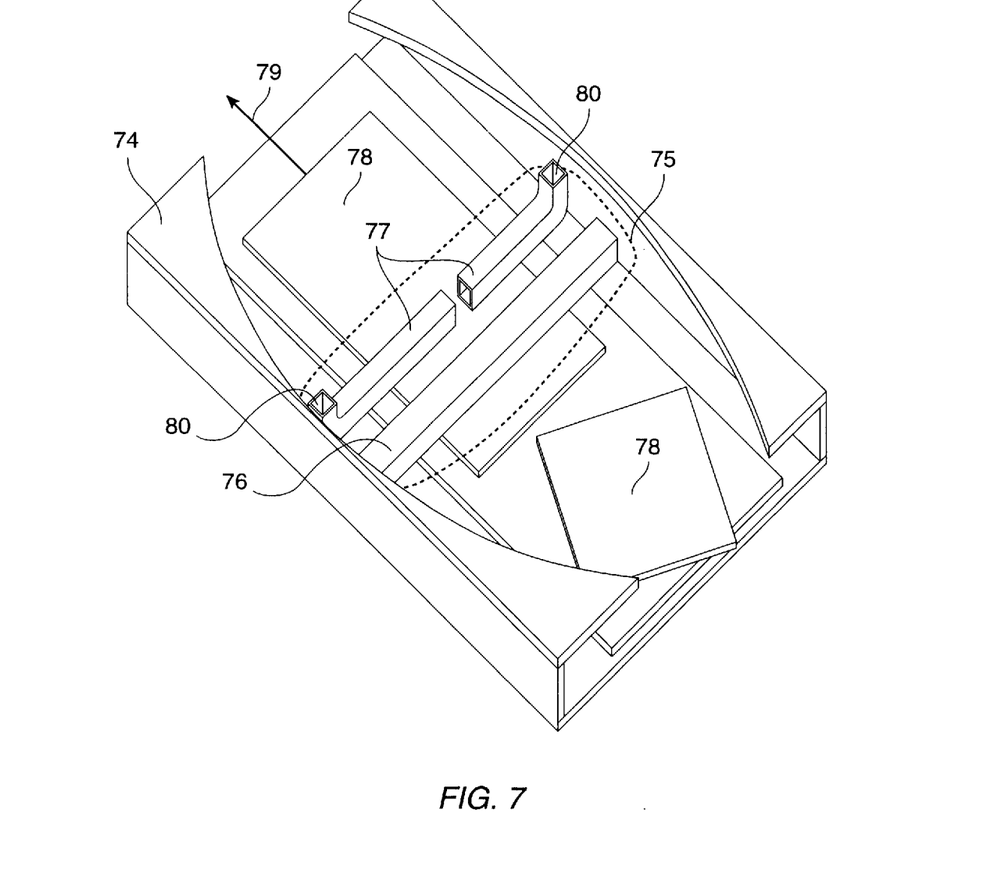
FIG. 7 is a perspective of an embodiment of the invention as practiced in an in-line coater.

FIG. 7 is a perspective of an embodiment of the invention as it would be used in an in-line coater. The top of the chamber 74 is shown cut away to allow the coating station 75 within the chamber to be seen. The coating station is comprised of at least one sputtering target 76 and at least one plasma generator 77 (one sputtering target and two plasma generators are shown in FIG. 7). Substrates 78 are transported in the direction of the arrow 79, so that they pass under the sputtering target and the plasma generator. As in the embodiment of FIG. 6, a pressure control system, not shown, regulates the partial pressure of reactant gas within the chamber, and a suitable power supply is connected to the sputtering target.

The arrangement of components within the coating chamber is similar to that of the embodiment shown in FIG. 6. A significant difference is that the width of the substrates that may pass through an in-line coater can be larger than four meters, while coaters employing a rotatable drum typically can coat an area of width less than one meter. The embodiment of FIG. 7 could be used with four-meter wide substrates and is shown with two plasma generators, placed end to end, each of which is two meters long. Microwave power enters the plasma generators through upward-pointing waveguide attachments as shown by the arrows 80.

A second fundamental difference between the embodiments of FIG. 6 and FIG. 7 is that the in-line machine permits only a single transit of the substrates past the coating station. Therefore, it is essential to deposit a layer of compounded material that is as thick as possible during a single transit. As previously indicated, the prior art provides separate deposition and reaction zones, and can not deposit a thick layer in a single transit, because when the layer is too thick, the bottom of the layer is blocked by the top of the layer from contacting the reactive gas. Thus separate deposition and reaction zones are incompatible with in-line machines.

Figure 8:
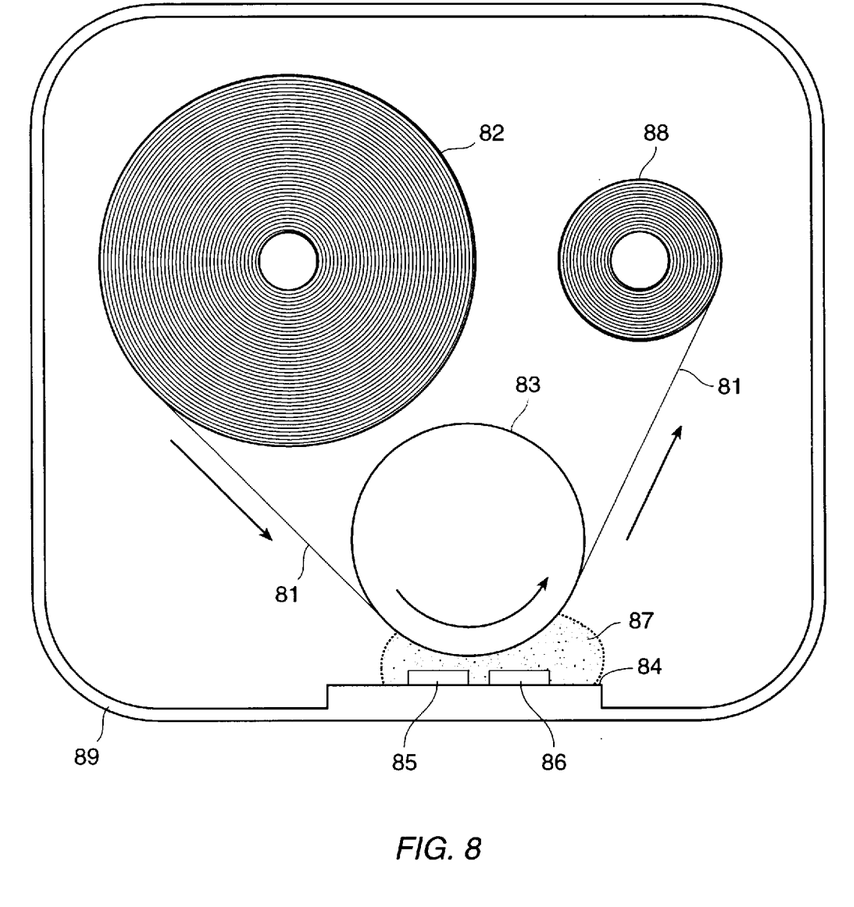
FIG. 8 is a section through an embodiment of the invention as it would be used in a roll coating process.

FIG. 8 is a section through a coating chamber 89 which has been configured for the purpose of coating a long continuous strip of flexible material which is stored in the chamber. The substrate strip 81 is taken from the storage spool 82 and passes around the outside of a guiding means such as a rotatable drum 83 so as to move into proximity with the coating station 84 mounted adjacent the drum. The coating station is comprised of a sputtering target 85 and an elongated plasma generator 86 both of which contribute power in the generation and sustenance of a plasma which is most concentrated in the zone 87. As the substrate passes the station, it receives a coating from the sputtering target which is fully compounded while the substrate passes through the zone 87 of intense plasma. A suitable control system, not shown, maintains the partial pressure of oxygen so that it is higher than the pressure required for full reaction and lower than the poisoning pressure threshold. As in other embodiments, a suitable power supply is connected to the sputtering target. The apparatus of FIG. 8 is known to the art as a roll coater and is often used in high volume industrial coating processes. It is similar to the in-line coater shown in FIG. 7 in that it allows only one transit of a target past and thus requires that the station deposit the largest possible amount of coating material during this transit.

EXAMPLES

The following examples illustrate the manner in which the present invention has been used to achieve high deposition rates to produce fully reacted multilayer optical interference coatings. Using the present invention they have been deposited on planar substrates as well as substrates that exhibited extreme curvature. In each of the examples a plasma guide microwave plasma generator was employed as taught in U.S. application Ser. No. 08/371,195, pending. Coating uniformity and quality were compatible with applications involving a wide range of stringent requirements.

The first example deals with the deposition of silicon dioxide in a drum coater in which a single coating station was used to deposit fully reacted silicon dioxide. The partial pressure of the reactive gas, oxygen, was maintained at 0.2 millitorr by an optical gas controller, OGC, connected to a piezoelectric flow valve that controlled the flow of oxygen into the chamber.

Example 1

Deposition of $SiO_2$

| Material | $SiO_2$ |
|---|---|
| Target Material | Silicon |
| Target Dimensions | 12.7 by 38 cm (5 by 15 inches) |
| Target Power | 6 Kilowatts |
| Microwave Power | 5 kilowatts |
| Argon Pressure | 4.0 militorr |
| Oxygen Pressure | 0.2 militorr |
| Drum Diameter | 0.8 meter |
| Drum Rotation Rate | 1 revolution per minute |
| Substrate Speed | 2.5 meter per minute |
| Deposition Rate Under Target | 145 Angstroms per second |
| Single Pass Deposition | 430 Angstroms |

In the above example, the drum rotation rate was one revolution per minute, on the order of sixty times lower than rates used in the art as taught by the Scobey et al. patent. As previously mentioned, higher drum rotation rates used in the prior are necessitated by the inability of the prior art to deposit more than a few monolayers during a single transit of the substrates through the sputtering region. The present invention, since it reacts the material as it is being deposited in a single pass by using a lower drum speed. The present invention can produce single layers that are thicker than the 430 Å obtained in the example by further reducing the speed at which the substrates travel past the coating station. The ability to produce thick coatings in a single pass, which is not provided by prior art, is required in any application to an in-line or roll coating process.

Example 2

Deposition of $Si_3N_4$

| Material | $Si_3N_4$ |
|---|---|
| Target Material | Silicon |
| Target Dimensions | 12.7 by 38 cm (5 by 15 inches) |
| Target Power | 5 Kilowatts |
| Microwave Power | 5 kilowatts |
| Argon Pressure | 5.0 militorr |
| Oxygen Pressure | 0.6 militorr |
| Drum Diameter | 0.8 meter |
| Drum Rotation Rate | 1 revolution per minute |
| Substrate Speed | 2.5 meter per minute |
| Deposition Rate Under Target | 60 Angstroms per second |
| Single Pass Deposition | 180 Angstroms |

The above example shows that while the rates obtainable when depositing silicon nitride are lower that those in the first example, where silicon dioxide was deposited, a 180 Å thick layer can be deposited in a single pass. The thickness of the layer can be multiplied by using a plurality of adjacent coating stations through which the substrates pass sequentially. Since, in contrast to prior art, no separation between stations is required, a large number of stations can be accommodated even in the relatively small process of the example which employs a 0.8 meter-diameter drum.

The next example applies to a process in which silicon dioxide was applied to the outside of cylindrical lamp envelopes. A plurality of lamps were mounted on a rotatable drum and the individual lamps were attached to a spinning means that was carried on the drum during its rotation. During the coating process the individual lamps spun on their cylindrical axes with the axis of spin parallel to the axis of drum rotation. In this example, the above-mentioned means of increasing deposition rate during a drum rotation by use of multiple stations (two in this case) was applied.

Example 3

Deposition of $SiO_2$ on Cylindrical Lamp Housings

| Material | $SiO_2$ |
|---|---|
| Target Material | Silicon |
| Target Dimensions | 12.7 by 38 cm (5 by 15 inches) |
| Number of Targets | 2 |
| Power per Target | 7.5 kilowatts |
| Microwave Power | 6 kilowatts |
| Argon Pressure | 4.0 militorr |
| Oxygen Pressure | 0.2 millitorr |
| Drum Diameter | 0.8 meter |
| Substrate Speed | 2.5 meter per minute |
| Single Pass Deposition | 590 Angstroms |

The next example illustrates the effect of the plasma generator on the sputtering process as has been discussed in connection with FIG. 2. The sputtering process was running under conditions described in the table below. The oxygen partial pressure was controlled by means of an OGC and a flow control valve to a level of 0.2 millitorr. Initially, the microwave power supply that was connected to the plasma generator in the coating station was turned off and the oxygen flow was set at a value of 205 sccms. Six kilowatts of microwave power was then applied to the generator. This caused the rate of reaction with the sputtered material to increase, so that the reacting film became a stronger pump, and the flow controller set the oxygen flow at a higher value of 310 sccms in order to maintain the same oxygen partial pressure. Referring to FIG. 2, this corresponds to jumping from curve C with the generator off to curve B, along the dotted line 21. With the microwave power being applied, a fully compounded film 750 Å thick was obtained in a single pass. The above is summarized in the following table.

Example 4

Influence of the Plasma Generator on the Pressure/Flow Curve

| Material | $Nb_2O_5$ |
|---|---|
| Target Material | Niobium |
| Target Dimensions | 12.7 by 38 cm (5 by 15 inches) |
| Number of Targets | 2 |
| Power per Target | 7 kilowatts |
| Microwave Power | 6 kilowatts or 0 kilowatts |
| Argon Pressure | 4.0 militorr |
| Nitrogen Pressure | 0.3 militorr |
| Drum Diameter | 0.8 meter |
| Drum Rotation Rate | 1 revolution per minute |
| Substrate Speed | 2.5 meter per minute |
| Single Pass Deposition | 750 Angstroms |

When the present invention is applied to in-line coaters or roll coaters, a significant increase in the rate of deposition of reacted film can be realized. In Table 1 sputtering rates achieved with the present invention comprised of a planar magnetron sputtering target installed adjacent to a plasmaguide generator in an in-line coater are compared with published rates for a state-of-the-art process employing a circular magnetron target. Values are given for absorption-free films of $Si_3N_4$, $TiO2$ and $SnO$. The maximum instantaneous rates achievable with the circular magnetron and the present invention as the substrate passes order the target are given in columns 2 and 3 respectively. The ratio of these rates is a measure of the improvement provided by the present invention and is given in column 4. The table shows that the rates achievable with the present invention exceed the circular magnetron rates by significant factors. Furthermore, the present invention was able to achieve these higher rates when the power being delivered to the sputtering target was lower compared to the circular magnetron power by a factor of 1.8. Column 5 of Table 1 shows that for the same sputtering power the rates achievable with the invention exceed the circular magnetron rates by factors ranging from 4.0 to 11.7 for the materials being compared.

TABLE 1

COMPARISON OF SPUTTERING RATES

| Material | C-Mag Rate Under Target (Å/sec) | Present Invention Rate Under Target (Å/sec) | Ratio | Ratio at Same Power |
|---|---|---|---|---|
| $Si_3N_4$ | 55 | 180 | 4.2 | 7.5 |
| $TiO_2$ | 25 | 80 | 2.2 | 4.0 |
| SnO | 23 | 150 | 6.5 | 11.7 |

The sputtering rate is a key parameter which determines the rate of production in an in-line or roll coating process. For a given required layer thickness λ and a sputtering target that sustains an average sputtering rate R as the substrate moves past it through a distance L, the substrate speed S may be calculated from the relation $$S = (R \times L)\lambda \qquad (6)$$

Comparing two processes with similar geometry, one of which uses the present invention and the other of which does not, one notes that due to the similar geometry the parameter L is the same for the two processes. The values of R are as given in Table 1, so that for the required vale of λ, the speed with the substrate passes through the coater is proportional to the values given in the table. Therefore it may be concluded from Table 1 and equation (6) that the speed of the substrates passing through a given machine and hence the rate of production can be increased by a factor between 4.0 and 11.7 for the same level of sputtering power being dissipated by the target. This comparison illustrates the significant economic benefit provided by the present invention.

We claim:

1. A method for reactive coating of substrates comprising providing a vacuum chamber and moving substrates therein, providing a first device in the form of a planar magnetron sputtering target positioned at a work station adjacent to said moving substrates, creating a plasma adapted for sputtering at least a selected material onto said substrates substantially at a base sputtering rate, providing a second device in the form of a microwave activated plasma generator positioned adjacent said first device, introducing a reactive gas at said work station, activating said plasma generator to excite and commingle with said plasma at least a portion of said reactive gas to create a reactive atmosphere at said work station, said reactive atmosphere acting to accelerate said sputtering to a rate substantially greater than said base sputtering rate and to convert said selected material to a different chemical species without substantially poisoning said planar magnetron sputtering target by actively controlling in dynamic manner the partial pressure of said gas at said work station.

2. The method of claim 1 wherein all of said selected material is coated onto said substrates and substantially completely converted to said different chemical species during a single pass of said substrates through said work station.

3. The method of claim 1 wherein the rate of sputtering said selected material onto said substrates substantially equals the rate of conversion of said selected material to said different chemical species.

4. The method of claim 1 wherein said means for controlling partial pressure of said second gas is operated such as to provide a partial pressure of said gas higher than that required for complete reaction with said selected material but lower than that which would cause poisoning of said target.

5. A sputter coating system for coating a substrate with a predetermined material comprising:

(a) a vacuum chamber having a work station site defined therein;

(b) a support assembly disposed within said vacuum chamber for supporting and displacing relative to said work station site at least one said substrate;

(c) sputtering target means disposed within said vacuum chamber at said work station site, said target means being adapted to generate a first plasma for sputtering said predetermined material onto said substrate substantially at a base sputtering rate when said substrate is positioned adjacent said work station site;

(d) plasma generation means disposed within said vacuum chamber adjacent said sputtering target means for generating adjacent said work station site a second plasma having associated therewith a partial pressure parameter, said second plasma commingling with said first plasma to form adjacent said work station site a sputter plasma, said sputter plasma being characterized by greater electron density and reactivity than said first plasma, said sputter plasma being adapted to accelerate said sputtering to a rate substantially greater than said base sputtering rate when said partial pressure parameter associated with said second plasma is maintained within a predetermined partial pressure range; and, (e) automatic control means for monitoring and actively maintaining said partial pressure parameter associated with said second plasma within said predetermined partial pressure range, whereby substantial electrochemical conversion of said sputtering target means responsive to said generation of said second plasma is inhibited.

6. The sputter coating system as recited in claim 5 wherein said sputtering target means includes a planar magnetron sputtering target device.

7. The sputter coating system as recited in claim 6 wherein said plasma generation means includes a microwave generator.

8. The sputter coating system as recited in claim 7 wherein said planar magnetron sputtering target device and said microwave generator are each extended in a direction perpendicular to a longitudinal direction.

9. The sputter coating system as recited in claim 8 wherein said support assembly displaces said substrate along a substrate travel direction, said substrate travel direction being oriented in substantially normal relation to said longitudinal direction.

10. The sputter coating system as recited in claim 6 wherein said plasma generation means includes gas introduction means for introducing into said vacuum chamber adjacent said work station site a reactive gas stream, said plasma generation means electrochemically exciting at least a portion of said reactive gas stream in generating said second plasma.

11. The sputter coating system as recited in claim 10 wherein said partial pressure parameter of said second plasma is the partial pressure of said reactive gas stream within said vacuum chamber.

12. The sputter coating system as recited in claim 11 wherein said predetermined partial pressure range is bounded by a lower boundary of a reaction threshold and an upper boundary of a poison threshold, said reaction threshold delineating the partial pressure parameter value necessary for complete chemical conversion of all said predetermined material sputtered onto said substrate into a different chemical species, said poison threshold delineating the partial pressure parameter value sufficient for chemical conversion of at least a portion of said sputter target means into a different chemical species.

13. The sputter coating system as recited in claim 12 wherein said control means includes a flow control device coupled to said gas introduction means for controlling the rate of flow of said reactive gas into said vacuum chamber.

14. The sputter coating system as recited in claim 13 wherein said control means includes a partial pressure monitoring device coupled to said flow control device for monitoring said partial pressure parameter.

15. The sputter coating system as recited in claim 6 wherein said support assembly includes a rotatable drum, said drum being adapted to support said substrate on an outer surface thereof.

16. The sputter coating system as recited in claim 15 wherein said work station site is disposed in spaced relation to said rotatable drum, said work station site opposing at least a portion of said rotatable drum outer surface during rotation of said rotatable drum.

17. The sputter coating system as recited in claim 6 wherein said support assembly includes a first spool member and a second spool member supporting opposing end portions of said substrate rolled respectively thereon, said first and second spools being cooperatively rotatable to pass said substrate adjacent said work station site.

18. The sputter coating system as recited in claim 6 wherein said support assembly includes a substantially planar platform for supporting and linearly transporting said substrate past said work station site.

19. The sputter coating system as recited in claim 5 wherein said automatic control means is an active feedback control sub-system.

* * * * *